(12) United States Patent
    Asayama

(10) Patent No.: US 10,512,168 B2
(45) Date of Patent: Dec. 17, 2019

(54) ELECTRONIC DEVICE AND METHOD OF MANUFACTURING THE SAME

(71) Applicant: MITSUBISHI ELECTRIC CORPORATION, Chiyoda-ku, Tokyo (JP)

(72) Inventor: Shinji Asayama, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/071,662

(22) PCT Filed: Feb. 9, 2017

(86) PCT No.: PCT/JP2017/004751
§ 371 (c)(1),
(2) Date: Jul. 20, 2018

(87) PCT Pub. No.: WO2017/141814
PCT Pub. Date: Aug. 24, 2017

(65) Prior Publication Data
US 2019/0075660 A1    Mar. 7, 2019

(30) Foreign Application Priority Data
Feb. 18, 2016    (JP) .................................. 2016-028802

(51) Int. Cl.
*H05K 3/34*    (2006.01)
*H05K 1/18*    (2006.01)
*H05K 3/32*    (2006.01)

(52) U.S. Cl.
CPC ........... *H05K 3/3442* (2013.01); *H05K 1/181* (2013.01); *H05K 3/321* (2013.01)

(58) Field of Classification Search
CPC ....... H05K 1/181; H03K 3/3442; H03K 3/321
See application file for complete search history.

(56) References Cited

U.S. PATENT DOCUMENTS 4,184,043 A * 1/1980 Hildering ............ H01L 21/4803
                                                         174/260
5,232,758 A    8/1993 Juskey et al.
(Continued)

FOREIGN PATENT DOCUMENTS

CH      619333 A5    9/1980
JP    58-51593 A    3/1983
(Continued)

OTHER PUBLICATIONS

International Search Report (PCT/ISA/210) dated Apr. 25, 2017, by the Japanese Patent Office as the International Searching Authority for International Application No. PCT/JP 2017/004751.
(Continued)

*Primary Examiner* — Nathan Milakovich
(74) *Attorney, Agent, or Firm* — Buchanan Ingersoll & Rooney PC

(57) ABSTRACT

The electronic device includes a printed circuit board having a first main surface, an electronic part mounted on the first main surface, and a first connection member connecting the printed circuit board and the electronic part. The printed circuit board includes at least one projection formed on the first main surface so as to project in a direction crossing the first main surface. The projection is formed outside the bottom surface of the electronic part which is located at the side of the first main surface. The first connection member is in contact with at least part of the projection, at least part of the bottom surface of the electronic part, and at least part of a lateral surface of the electronic part intersecting the bottom surface.

10 Claims, 8 Drawing Sheets

(56) References Cited

U.S. PATENT DOCUMENTS

| | | | | |
|---|---|---|---|---|
| 5,684,677 A * | 11/1997 | Uchida | ............... | H05K 3/303 |
| | | | | 361/770 |
| 6,054,653 A * | 4/2000 | Hansen | ............... | H05K 1/111 |
| | | | | 174/261 |
| 6,115,262 A * | 9/2000 | Brunner | ............... | H05K 1/111 |
| | | | | 174/260 |
| 6,144,558 A * | 11/2000 | Shiota | ............... | H05K 3/305 |
| | | | | 174/254 |
| 6,441,478 B2 * | 8/2002 | Park | ............... | H01L 21/563 |
| | | | | 257/687 |
| 6,445,589 B2 * | 9/2002 | Chengalva | ............... | H05K 3/303 |
| | | | | 174/255 |
| 6,614,122 B1 * | 9/2003 | Dory | ............... | H01L 21/563 |
| | | | | 257/783 |
| 6,743,696 B2 * | 6/2004 | Jeung | ............... | H01L 23/5389 |
| | | | | 257/E21.705 |
| 6,756,666 B2 * | 6/2004 | Hosomi | ............... | H01L 23/13 |
| | | | | 257/690 |
| 7,186,926 B2 * | 3/2007 | Maeno | ............... | H05K 1/111 |
| | | | | 174/260 |
| 7,268,437 B2 * | 9/2007 | Liu | ............... | H01L 23/3121 |
| | | | | 257/780 |
| 8,039,760 B2 * | 10/2011 | Sagawa | ............... | H05K 3/247 |
| | | | | 174/260 |
| 8,263,875 B2 * | 9/2012 | Nodo | ............... | H05K 1/111 |
| | | | | 174/252 |
| 8,350,383 B2 * | 1/2013 | Daubenspeck | ............... | H01L 21/563 |
| | | | | 257/730 |
| 9,078,358 B2 * | 7/2015 | Toratani | ............... | H05K 1/0263 |
| 9,095,066 B2 * | 7/2015 | Kusumoto | ............... | H05K 1/111 |
| 9,237,686 B2 * | 1/2016 | Motomura | ............... | H05K 13/0465 |
| 10,117,332 B2 * | 10/2018 | Park | ............... | H05K 1/113 |

FOREIGN PATENT DOCUMENTS

| | | |
|---|---|---|
| JP | 58-97893 A | 6/1983 |
| JP | 59-9996 A | 1/1984 |
| JP | 59-127267 U | 8/1984 |
| JP | 60-158774 U | 10/1985 |
| JP | 61-27279 U | 2/1986 |
| JP | 11-54894 A | 2/1999 |
| JP | 2004-342766 A | 12/2004 |

OTHER PUBLICATIONS

Extended European Search Report dated Jan. 24, 2019 in European Patent Office, in corresponding EP No. 17753072.2-1203 (7 pages).

* cited by examiner

ELECTRONIC DEVICE AND METHOD OF MANUFACTURING THE SAME

TECHNICAL FIELD

The present invention relates to an electronic device including a printed circuit board and an electronic part and a method of manufacturing the electronic device. In particular, the present invention relates to an electronic device including a printed circuit board and an electronic part connected to each other with an adhesive and a method of manufacturing the electronic device.

BACKGROUND ART

In known techniques, an adhesive is used to mount parts such as electronic parts on a printed circuit board. Such techniques are mainly classified into the following two techniques according to the intended use of the adhesive.

In one of the techniques, an adhesive is used to temporarily fix a printed circuit board and an electronic part before soldering when the electronic part is mounted on the printed circuit board by soldering. This technique is widely adopted to temporarily fix a part to be mounted on a surface of a printed circuit board when simultaneously soldering the part to be mounted on the surface and a part to be inserted into and mounted on the printed circuit board. In relation to this technique, another technique is contrived that prevents an adhesive preliminarily formed on a printed circuit board from being pressed and spread by an electronic part and then protruding beyond a predetermined position on the printed circuit board (for example, see Japanese Patent Laying-Open No. 59-9996, Japanese Patent Laying-Open No. 58-51593, Japanese Patent Laying-Open No. 58-97893, Japanese Utility Model Laying-Open No. 59-127267, Japanese Utility Model Laying-Open No. 61-27279). These techniques aim to control the behavior of an adhesive pressed and spread by a part disposed on the printed circuit board, thereby preventing or reducing a protrusion of the adhesive.

The other technique uses a conductive adhesive as a material alternative to a solder.

CITATION LIST

Patent Document

PTD1: Japanese Patent Laying-Open No. 59-9996
PTD2: Japanese Patent Laying-Open No. 58-51593
PTD3: Japanese Patent Laying-Open No. 58-97893
PTD4: Japanese Utility Model Laying-Open No. 59-127267
PTD5: Japanese Utility Model Laying-Open No. 61-27279

SUMMARY OF INVENTION

Technical Problem

With these conventional techniques, however, it is difficult to provide a sufficiently large area of an adhesive which is connected to an electronic part mounted on a printed circuit board.

For example, in use of an adhesive in preliminarily fixing, a protrusion of the adhesive needs to be prevented or reduced while reflecting variations in the amount of the adhesive to be applied or the like. In this case, the amount of the adhesive to be applied needs to be increased for providing a sufficiently large connection area between the part and the adhesive. However, the behavior of the adhesive is difficult to control with an increased amount of the adhesive to be applied, making it difficult to provide a sufficiently large connection area between the electronic part and the adhesive.

In the use of a conductive adhesive, the conductive adhesive does not wet-spread in a manner similar to that of a flux-containing solder. In the method of mounting an electronic part on a printed circuit board by disposing the part on a conductive adhesive applied onto the printed circuit board, the conductive adhesive is connected to the bottom surface of the electronic part which is located at the side of the printed circuit board but does not wet-spread to a lateral surface of the electronic part intersecting the bottom surface. In such a conventional method, accordingly, it is difficult to provide a sufficiently large connection area between the conductive adhesive and the lateral surface of the electronic part.

The present invention has been made to solve the above problem. A main object of the present invention is to provide an electronic device capable of providing a sufficiently large connection area between an electronic part and an adhesive and a method of manufacturing the electronic device.

Solution to Problem

An electronic device according to the present invention includes a printed circuit board having a first main surface, an electronic part mounted on the first main surface, and a first connection member connecting the printed circuit board and the electronic part. The printed circuit board includes at least one projection formed on the first main surface so as to project in a direction crossing the first main surface. The projection is formed outside a bottom surface of the electronic part located at a side of the first main surface. The first connection member is in contact with at least part of the projection, at least part of the bottom surface of the electronic part, and at least part of a lateral surface of the electronic part intersecting the bottom surface.

A method of manufacturing an electronic device according to the present invention is a method of manufacturing an electronic device including a printed circuit board and an electronic part. The method of manufacturing an electronic device according to the present invention includes forming the printed circuit board having a first main surface and including at least one projection formed on the first main surface so as to project in a direction crossing the first main surface, forming on the first main surface a first connection member for connecting the printed circuit board and the electronic part, and disposing the electronic part on the first main surface. In the forming of the printed circuit board, the projection is formed on the first main surface located outside a bottom surface of the electronic part disposed at a side of the first main surface in the disposing. In the forming of the first connection member, the first connection member is formed on the first main surface so as to cover from a region of the first main surface to at least part of the projection at a side of the bottom surface, the region overlapping the bottom surface of the electronic part disposed in the disposing. In the disposing, the electronic part is disposed on the first main surface such that the bottom surface of the electronic part disposed at the side of the first main surface overlaps the first connection member and does not overlap the projection.

Advantageous Effects of Invention

The present invention can provide an electronic device capable of providing a sufficiently large connection area between an electronic part and an adhesive and a method of manufacturing the electronic device.

DESCRIPTION OF EMBODIMENTS

Figure 1:
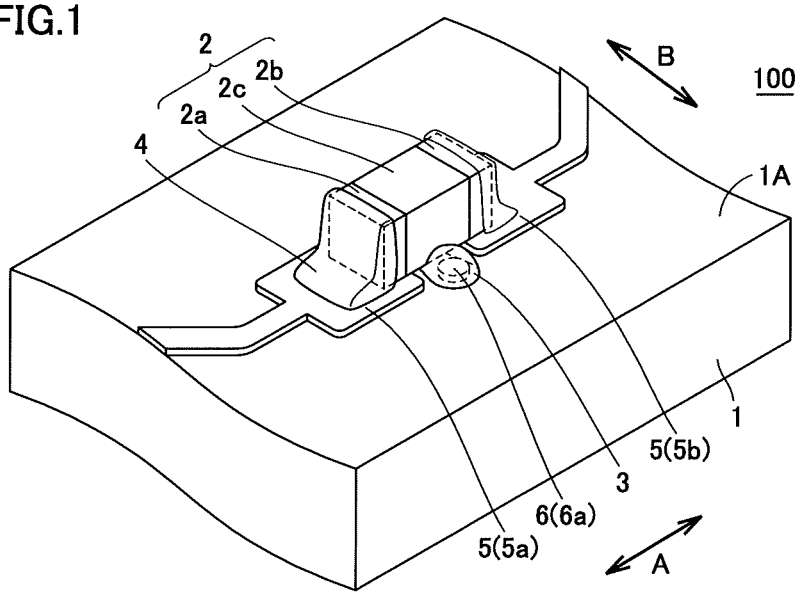
FIG. 1 is a perspective view of an electronic device according to Embodiment 1.

Embodiments of the present invention will be described below with reference to the drawings. In the drawings, the same or corresponding portions will be denoted by the same or like references, and description thereof will not be repeated.

Embodiment 1

Configuration of Electronic Device

Figure 2:
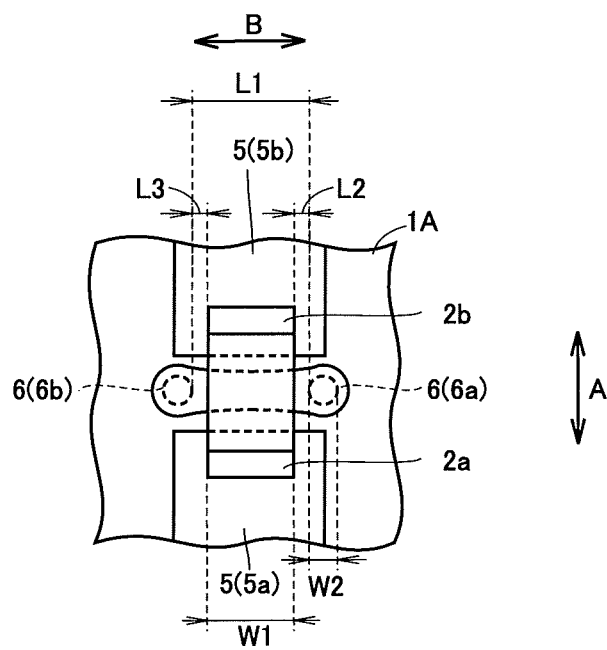
FIG. 2 is a plan view of the electronic device according to Embodiment 1.
Figure 3:
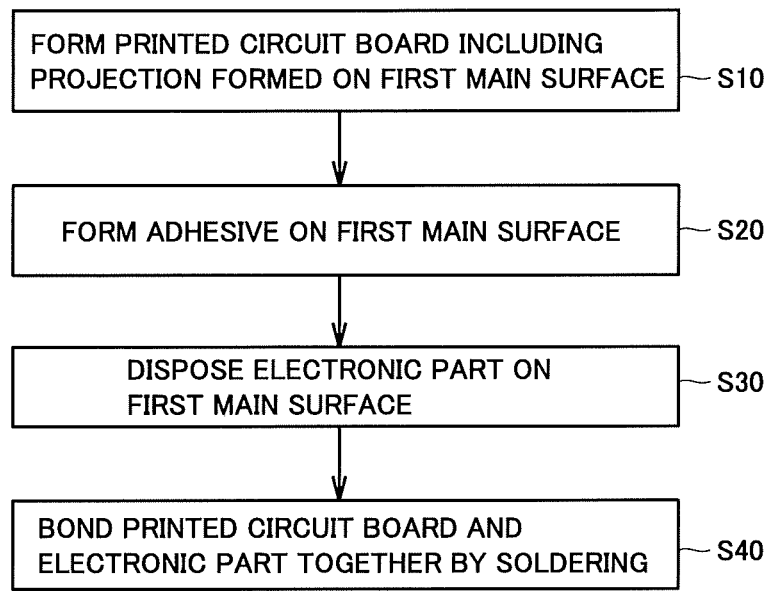
FIG. 3 is a flowchart showing a method of manufacturing the electronic device according to Embodiment 1.

With reference to FIGS. 1 and 2, an electronic device 100 according to Embodiment 1 will be described. Electronic device 100 mainly includes a printed circuit board 1 and a ceramic chip capacitor 2 (hereinafter, merely a chip capacitor) that is an electronic part. In electronic device 100, printed circuit board 1 and chip capacitor 2 are mechanically connected to each other with an adhesive 3 (first connection member), and are also mechanically and electrically connected to each other with a solder 4 (second connection member). Herein, "being mechanically connected" means a relationship in which directly or indirectly connected members are dynamically associated with each other. Also, "being electrically connected" means a state in which a current can flow between directly or indirectly connected members.

The material for printed circuit board 1 has electrical insulation properties. Printed circuit board 1 has a first main surface 1A. For the convenience of the description, two directions that extend along first main surface 1A and are orthogonal to each other will be referred to as a first direction A and a second direction B (see FIG. 1). On first main surface 1A, a plurality of conductor lands 5 and a plurality of projections 6 are formed at a spacing therebetween. Conductor lands 5 are formed as part of a wiring pattern formed on first main surface 1A. First main surface 1A is a frontmost surface of printed circuit board 1 when chip capacitor 2 is mounted in a method of manufacturing electronic device 100. Chip capacitor 2 has a pair of electrode portions 2a and 2b. Electrode portions 2a and 2b are disposed on conductor lands 5 (5a, 5b).

The plurality of conductor lands 5 include a pair of conductor lands 5a and 5b formed at a spacing therebetween in first direction A on first main surface 1A. Conductor lands 5a and 5b project in the direction (e.g., perpendicular direction) crossing first main surface 1A from first main surface 1A. The material for conductor lands 5 is conductive. Conductor lands 5 are made of, for example, copper (Cu) or the like. The distance between conductor lands 5a and 5b in first direction A is smaller than the distance between electrode portions 2a and 2b of chip capacitor 2.

The plurality of projections 6 project from first main surface 1A in the direction (e.g., perpendicular direction) crossing first main surface 1A. The plurality of projections 6 include projections 6a and 6b formed at a spacing therebetween in second direction B. Second direction B is a direction extending along first main surface 1A and crossing (for example, orthogonal to) first direction A. Projections 6a and 6b are formed between two conductor lands 5a and 5b in first direction A. Projections 6a and 6b are formed, for example, at the center between conductor lands 5a and 5b in first direction A. Projections 6a and 6b can have any structure and have, for example, a cylindrical shape. Projections 6a and 6b are formed of, for example, the same material as that for conductor lands 5a and 5b and have the same film thickness (a height in the direction perpendicular to first main surface 1A) as that of conductor lands 5a and 5b. That is to say, the top surfaces of projections 6a and 6b are flush with, for example, a surface (hereinafter, a bottom surface) of chip capacitor 2 which is located at the side of first main surface 1A. Projections 6a and 6b can have any height H1 (see FIG. 4) in the direction perpendicular to first main surface 1A, which is, for example, 0.01 mm or more and 0.5 mm or less. Projections 6a and 6b can have any width W2 in second direction B, which is, for example, 0.03 mm or more and 1.5 mm or less.

Projections 6a and 6b are formed outside the profile line of the bottom surface of chip capacitor 2. That is to say, a distance L1 between projections 6a and 6b in second direction B (see FIG. 2) is greater than a width W1 of chip capacitor 2 in the direction perpendicular to the direction connecting electrode portions 2a and 2b on the bottom surface (see FIG. 2). A distance L2 between the perimeter of the bottom surface of chip capacitor 2 and projection 6a is equal to, for example, a distance L3 between the perimeter of the bottom surface of chip capacitor 2 and projection 6b. Distances L2 and L3 are the shortest distances in the direction (second direction B) extending along first main surface 1A and extending from chip capacitor 2 toward projections 6a and 6b. Distances L2 and L3 are preferably smaller than or equal to height H1 of projections 6a and 6b in the direction perpendicular to first main surface 1A (see FIG. 4). Distances L2 and L3 are preferably greater than or equal to width W2 of projections 6a and 6b in second direction B. Height H1 of projections 6a and 6b in the direction perpendicular to first main surface 1A is equal to the height (thickness) of conductor lands 5a and 5b in the direction perpendicular to first main surface 1A.

Projection 6a is formed, for example, so as to overlap a line segment connecting one end of conductor land 5a and one end of conductor land 5b in second direction B and extending along first direction A. Projection 6b is formed, for example, so as to overlap a line segment connecting the other end of conductor land 5a and the other end of conductor land 5b in second direction B and extending along first direction A.

Adhesive 3 is connected to a body 2c of chip capacitor 2 except for electrode portions 2a and 2b and is also connected to first main surface 1A and projections 6a and 6b. Adhesive 3 is mechanically connected to at least part of a region of first main surface 1A between projections 6a and 6b. Further, adhesive 3 is mechanically connected to the entire surfaces of projections 6a and 6b. In other words, adhesive 3 is formed so as to cover projections 6a and 6b. Further, adhesive 3 is mechanically connected to part of the bottom surface of body 2c of chip capacitor 2 and part of a lateral surface of body 2c which intersects the bottom surface. The material for adhesive 3 can be any material for a conventional adhesive and is, for example, an epoxy resin adhesive.

Solder 4 mechanically and electrically connects electrode portions 2a and 2b of chip capacitor 2 and conductor lands 5a and 5b. The material for solder 4 includes, for example, an alloy solder such as a gold-tin (AuSn)-based solder, gold-germanium (AuGe)-based solder, lead-tin (PbSn)-based solder, indium-tin (InSn)-based solder, or silver-tin (AgSn)-based solder. Solder 4 also wet-spreads on the surfaces (e.g., perpendicular surfaces) of electrode portions 2a and 2b of chip capacitor 2 which intersect first main surface 1A.

Method of Manufacturing Electronic Device

With reference to FIGS. 3 to 6, a method of manufacturing electronic device 100 according to Embodiment 1 will now be described. The method of manufacturing electronic device 100 mainly includes a step (S10) of forming printed circuit board 1 including projection 6, a step (S20) of forming adhesive 3, a step (S30) of disposing chip capacitor 2, and a step (S40) of bonding chip capacitor 2 and conductor lands 5a and 5b together with solder 4.

Figure 4:
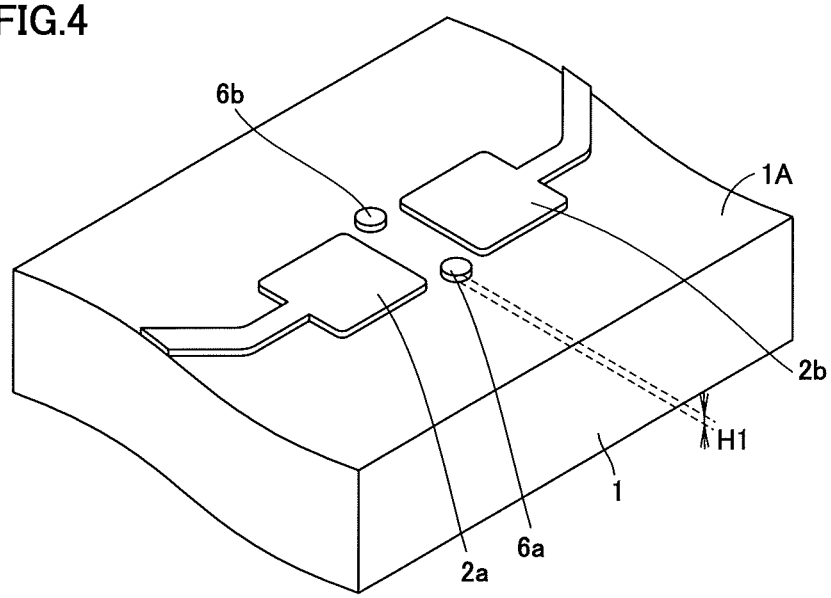
FIG. 4 is a perspective view showing the method of manufacturing the electronic device according to Embodiment 1.

In the step (S10), printed circuit board 1 having first main surface 1A is first prepared. As shown in FIG. 4, subsequently, projections 6a and 6b are formed together with conductor lands 5a and 5b. For example, a conductive film having a predetermined thickness is first deposited on first main surface 1A of printed circuit board 1. Subsequently, a mask film is formed on the conductive film by, for example, photolithography. Openings are formed in the region of the mask film in which conductor lands 5a and 5b and projections 6a and 6b are to be formed. Subsequently, the conductive film on first main surface 1A is etched with the mask film. In this manner, conductor lands 5a and 5b and projections 6a and 6b are simultaneously formed on first main surface 1A. Projections 6a and 6b are formed so as to be located outside the bottom surface of chip capacitor 2, which is disposed in the later step (S40).

Figure 5:
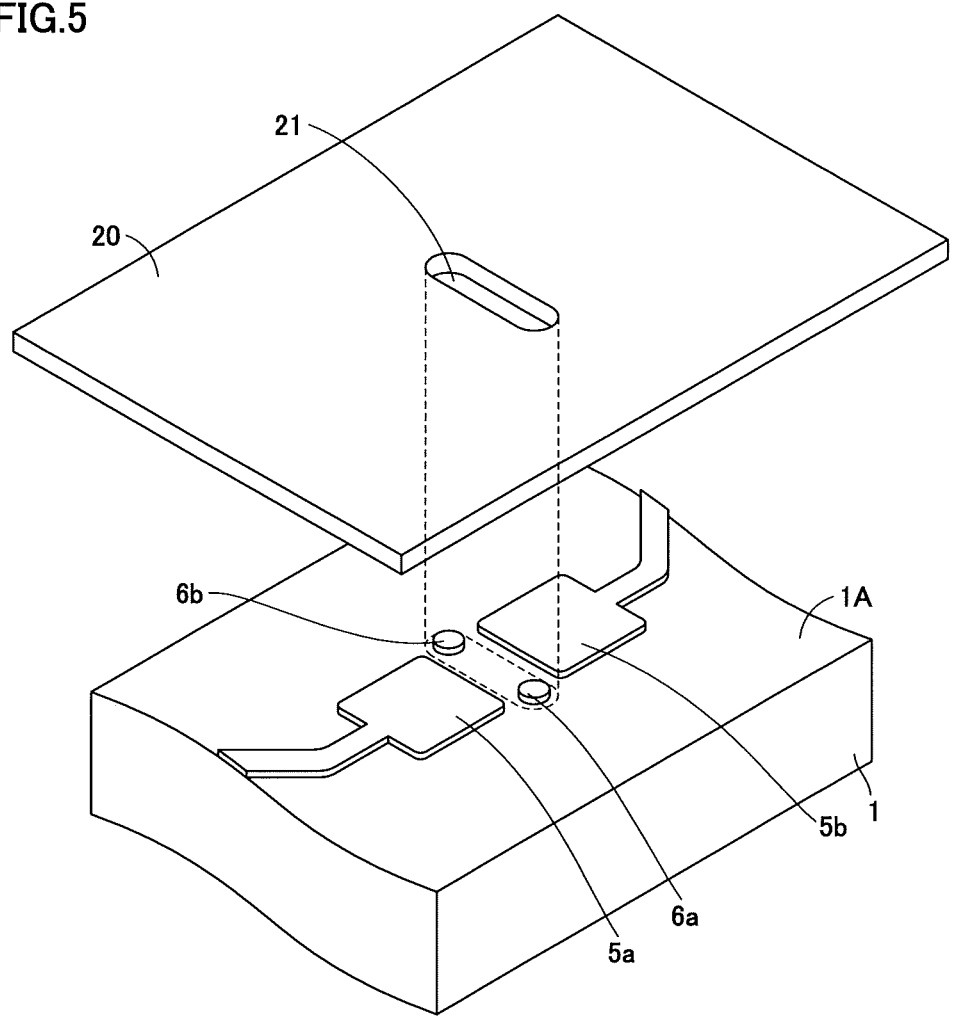
FIG. 5 is a perspective view showing the method of manufacturing the electronic device according to Embodiment 1.
Figure 6:
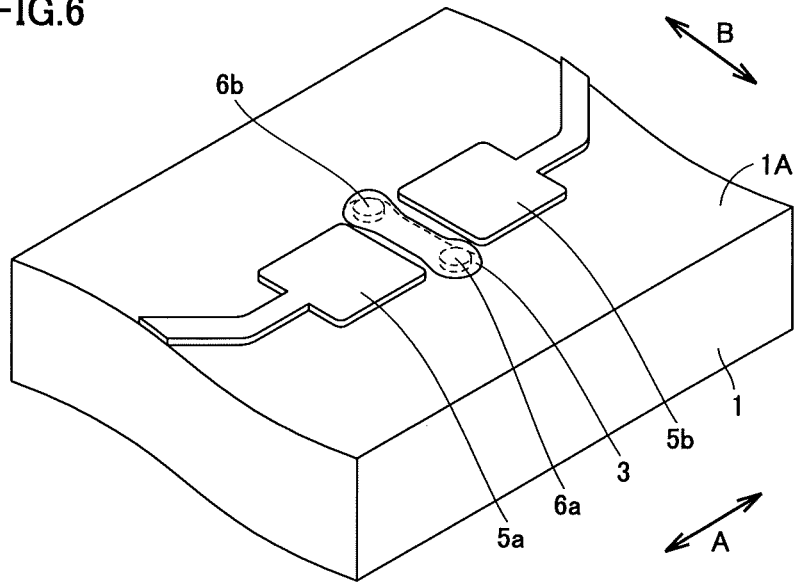
FIG. 6 is a perspective view showing the method of manufacturing the electronic device according to Embodiment 1.

In the step (S20), as shown in FIG. 5, adhesive 3 is subsequently formed on first main surface 1A. First, a mask screen 20 is prepared. Mask screen 20 has opening 21 formed therein. Opening 21 is formed so as to receive projections 6a and 6b simultaneously inside opening 21 in plan view. From a different perspective, opening 21 has the greatest width that is greater than or equal to, for example, the longest distance between projections 6a and 6b, that is, a distance between one end of projection 6a farthest from projection 6b in second direction B and one end of projection 6b farthest from projection 6a in second direction B. Opening 21 has the smallest width greater than or equal to, for example, the outside diameter of each of projections 6a and 6b. The material for mask screen 20 is, for example, stainless steel.

Subsequently, mask screen 20 is disposed such that a portion thereof in which opening 21 is not formed is in contact with conductor lands 5a and 5b and that opening 21 overlaps projections 6a and 6b when first main surface 1A is seen in plan view.

Adhesive 3 is subsequently supplied into opening 21. At this supply, at least part of adhesive 3 is supplied onto first main surface 1A through, for example, projections 6a and 6b. Adhesive 3 is formed so as to entirely cover projections 6a and 6b. At this formation, controlling a pressure at which adhesive 3 is supplied into opening 21 to be relatively low can prevent or reduce the seepage of adhesive 3 from a gap between mask screen 20 and printed circuit board 1. The thickness of (the height from first main surface 1A) of adhesive 3 formed on first main surface 1A located between projections 6a and 6b is formed to be greater than at least the heights of conductor lands 5a and 5b. The thickness (the height from first main surface 1A) of adhesive 3 formed on projections 6a and 6b is smaller than or equal to, for example, the thickness of adhesive 3 formed on first main surface 1A located between projections 6a and 6b. Adhesive 3 formed in the step (S30) has, for example, a saddle shape. The width of adhesive 3 in first direction A which is formed at the center between projections 6a and 6b in second direction B is smaller than, for example, the width of adhesive 3 in first direction A which is formed around projections 6a and 6b.

The planar shape of opening 21 may be circular or oblong, and is preferably oblong. Opening 21 having an oblong planar shape leads to a small ratio of the area of the inner peripheral surface of opening 21 of mask screen 20 to the area of the opening and accordingly has a small contact resistance between adhesive 3 and mask screen 20, compared with opening 21 having a circular planar shape. Compared with opening 21 having a circular planar shape, opening 21 having an oblong planar shape thus has high printability and small variations in the amount of adhesive 3 to be actually applied onto first main surface 1A.

In the step (S30), subsequently, chip capacitor 2 is disposed on first main surface 1A. Electrode portion 2a of chip capacitor 2 is disposed on conductor land 5a, and electrode portion 2b of chip capacitor 2 is disposed on conductor land 5b. At this disposing, body 2c is disposed on adhesive 3 on the bottom surface of chip capacitor 2. At the same time, chip capacitor 2 is disposed such that projections 6a and 6b are located outside the profile line of the bottom surface. In other words, chip capacitor 2 is formed such that the bottom surface does not overlap projections 6a and 6b. Adhesive 3 is pressed and spread by chip capacitor 2, and is applied and spread around the region formed in the step (S20). Part of the bottom surface of body 2c and part of a lateral surface of chip capacitor 2 are thus mechanically connected to each other with adhesive 3. Adhesive 3 is subsequently cured, thus bonding printed circuit board 1 and chip capacitor 2 together with adhesive 3.

In the step (S40), subsequently, electrode portions 2a and 2b of chip capacitor 2 and conductor lands 5a and 5b are mechanically and electrically connected to each other with solder 4. Although a typical soldering method is performed by a flow soldering apparatus using a solder jet flow, another soldering method may be used. For example, a method by a small-sized point flow apparatus using a solder jet flow or a method using a wire solder and a soldering iron may be used. Electronic device 100 according to Embodiment 1 can be manufactured in this manner.

It suffices that in electronic device 100, adhesive 3 is formed so as to be in contact with at least part of each of projections 6a and 6b. For example, adhesive 3 may be formed only on part of each of the top surfaces of projections 6a and 6b, the part being located at the side of chip capacitor 2. Alternatively, adhesive 3 may be formed only on part of each of the lateral surfaces of projections 6a and 6b, the part being located at the side of chip capacitor 2.

Figure 7:
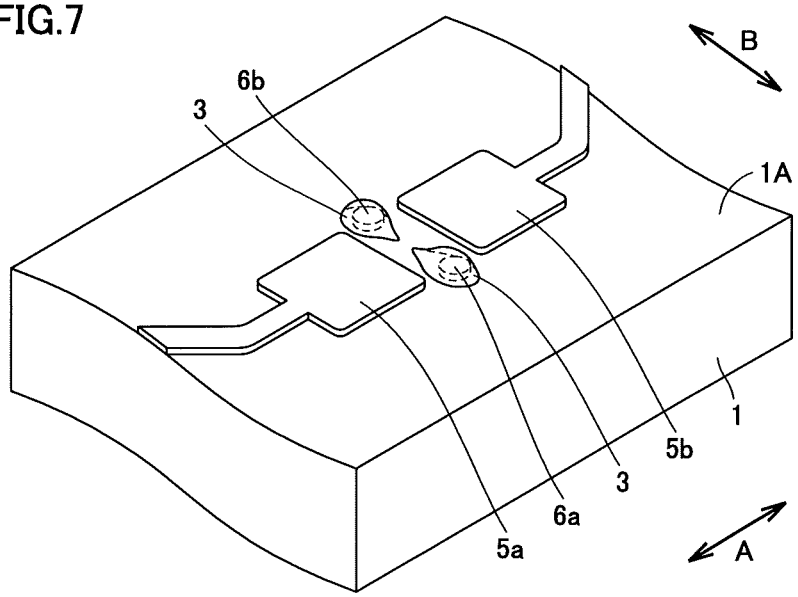
FIG. 7 is a perspective view showing a modification of the method of manufacturing the electronic device according to Embodiment 1.

With reference to FIG. 7, adhesive 3 may be formed so as to cover projections 6a and 6b and may not be formed on the central portion between projections 6a and 6b in second direction B.

Electronic device 100 can have any dimensions. Although chip capacitor 2 can have any dimensions, two sides of the bottom surface are typically, for example, 1.0 mm and 0.5 mm. When the bottom surface of chip capacitor 2 has dimensions of 1.0 mm×0.5 mm, the width of adhesive 3 formed between conductor lands 5a and 5b in first direction A is preferably 0.2 mm or more and 0.3 mm or less. In this case, further, mask screen 20 preferably has a thickness of 0.1 mm or more and 0.2 mm or less.

Function and Effect of Electronic Device

The function and effect of electronic device 100 according to Embodiment 1 will now be described.

Electronic device 100 includes printed circuit board 1 having first main surface 1A, chip capacitor 2 (electronic part) mounted on first main surface 1A, and adhesive 3 (first connection member) connecting printed circuit board 1 and chip capacitor 2. Printed circuit board 1 includes a plurality of projections 6a and 6b formed on first main surface 1A so as to project in a direction crossing first main surface 1A. Projections 6a and 6b are formed outside the bottom surface of chip capacitor 2 located at the side of first main surface 1A. Adhesive 3 is in contact with at least part of each of projections 6a and 6b. Adhesive 3 is further in contact with at least part of the bottom surface of chip capacitor 2 and at least part of a lateral surface of chip capacitor 2.

In electronic device 100, adhesive 3 is applied and spread onto part of the bottom surface and part of the lateral surface of body 2c of chip capacitor 2. Electronic device 100 thus has a sufficiently large connection area between chip capacitor 2 and adhesive 3 and accordingly has a sufficiently high bonding strength between printed circuit board 1 and chip capacitor 2, compared with a conventional electronic device.

Adhesive 3 is formed so as to cover projections 6a and 6b. In electronic device 100, for example, adhesive 3 formed on the top portions of projections 6a and 6b can be in contact with a position on the lateral surface of chip capacitor 2 which is farther from first main surface 1A. This leads to an increased area of the lateral surface of chip capacitor 2 which is in contact with adhesive 3.

In electronic device 100, projections 6a and 6b are formed at a spacing from the perimeter of the bottom surface. Spacings L2 and L3 are greater than or equal to height H1 of projections 6a and 6b in the direction perpendicular to first main surface 1A. Spacings L2 and L3 are smaller than or equal to width W2 of projections 6a and 6b in the direction (second direction B) extending along first main surface 1A and extending from chip capacitor 2 toward projections 6a and 6b. Consequently, adhesive 3 formed so as to cover projections 6a and 6b in the step (S20) of the method of manufacturing electronic device 100 can be pressed against the bottom surface of chip capacitor 2 in the step (S30) to pass through between projections 6a and 6b having the above-mentioned spacing and the bottom surface of chip capacitor 2 and be pressed against and spread onto a lateral surface of chip capacitor 2. Electronic device 100 accordingly has a sufficiently large connection area between chip capacitor 2 and adhesive 3 and accordingly has a sufficiently high bonding strength between printed circuit board 1 and chip capacitor 2, compared with a conventional electronic device.

In electronic device 100, printed circuit board 1 includes conductor lands 5a and 5b (wiring pattern) formed in first main surface 1A. Projections 6a and 6b are formed on the regions of first main surface 1A in which conductor lands 5a and 5b are not formed. Adhesive 3 mechanically connects the region of first main surface 1A in which conductor lands 5a and 5b are not formed and chip capacitor 2. Electronic device 100 further includes solder 4 electrically connecting conductor lands 5a and 5b and chip capacitor 2. This allows printed circuit board 1 and chip capacitor 2 to be temporarily fixed to each other with adhesive 3 before being bonded together with solder 4. The bonding strength between printed circuit board 1 and chip capacitor 2 provided by adhesive 3 is sufficiently high as described above, thus preventing or reducing the separation of printed circuit board 1 and chip capacitor 2 from each other before being bonded together with solder 4.

The method of manufacturing electronic device 100 is a method of manufacturing an electronic device including printed circuit board 1 and chip capacitor 2. The method of manufacturing the electronic device according to the present invention includes a step (S10) of forming printed circuit board 1 having first main surface 1A and including a plurality of projections 6a and 6bs formed on first main surface 1A so as to project in the direction crossing first main surface 1A, a step (S30) of forming adhesive 3 for connecting printed circuit board 1 and chip capacitor 2 on first main surface 1A, and a step (S30) of disposing chip capacitor 2 on first main surface 1A. In the step (S10) of forming printed circuit board 1, projections 6a and 6b are formed on first main surface 1A located outside the bottom surface of chip capacitor 2 disposed at the side of first main surface 1A in the disposing step (S20). In the step (S20) of forming adhesive 3, adhesive 3 is formed on first main surface 1A so as to cover from part of the region of first main surface 1A which overlaps the bottom surface of chip capacitor 2 disposed in the step (S30) to at least part of first main surface 1A which is located at the side of bottom surfaces of projections 6a and 6b. In the disposing step (S30), chip capacitor 2 is disposed on first main surface 1A such that the bottom surface of chip capacitor 2 which is disposed at the side of first main surface 1A overlaps adhesive 3 and does not overlap projections 6a and 6b.

Thus, the shape of adhesive 3 formed in the step (S20) can be controlled in accordance with the shapes of projections 6a and 6b. Additionally, the position at which chip capacitor 2 disposed in the step (S30) is disposed is controlled with respect to adhesive 3 and projections 6a and 6b as described above. Consequently, the shape of adhesive 3 bonding printed circuit board 1 and chip capacitor 2 together after adhesive 3 is pressed and spread by chip capacitor 2 in the step (S30) can be controlled in accordance with the shapes of projections 6a and 6b. The method of manufacturing electronic device 100 according to Embodiment 1 can thus improve controllability of the shape of the adhesive to be applied more than a conventional method of manufacturing an electronic device in which the shape of the adhesive to be applied is controlled mainly in accordance with an amount of the adhesive to be applied.

For example, since it is necessary to prevent adhesive 3 pressed and spread by chip capacitor 2 from reaching conductor lands 5a and 5b, the amount of adhesive 3 to be applied is generally controlled to be smaller than, for example, the amount of solder 4 to be applied or the like. However, control of variations in the amount to be applied becomes more difficult with a smaller application amount of adhesive 3. This may lead to a bonding failure between a printed circuit board and a chip capacitor due to variations in the amount of an adhesive to be applied in a conventional electronic device with an amount of the adhesive to be applied which is set to be relatively small. In contrast, the method of manufacturing electronic device 100 according to Embodiment 1 can control the shape of adhesive 3 in accordance with the shapes of projections 6a and 6b even with a small amount of adhesive 3 to be applied.

In the method of manufacturing electronic device 100 according to Embodiment 1, particularly, projections 6a and 6b are formed on first main surface 1A located outside the bottom surface of chip capacitor 2 disposed at the side of first main surface 1A in the disposing step (S30). Adhesive 3 is formed on first main surface 1A so as to cover from part of the region of first main surface 1A which overlaps the bottom surface of chip capacitor 2 to at least part of first main surface 1A which is located at the side of bottom surfaces of projections 6a and 6b. Even with, for example, a small amount of adhesive 3 applied as shown in FIG. 7, adhesive 3 formed on the top surfaces of projections 6a and 6b is thus located at a high level in the direction perpendicular to first main surface 1A compared with adhesive 3 formed on first main surface 1A, and can accordingly be connected to a higher portion of the lateral surface of chip capacitor 2. Further, adhesive 3 that has been pressed by the bottom surface of chip capacitor 2 and then flowed along first main surface 1A is flowed in the direction crossing first main surface 1A by projections 6a and 6b. This allows adhesive 3 to wet-spread onto a lateral surface of chip capacitor 2. The method of manufacturing electronic device 100 can manufacture electronic device 100 having a sufficiently large connection area between chip capacitor 2 and adhesive 3 and accordingly having a sufficiently high bonding strength between printed circuit board 1 and chip capacitor 2, compared with a conventional electronic device.

In the method of manufacturing electronic device 100, in the step (S20) of forming adhesive 3, adhesive 3 is formed by screen printing using mask screen 20 having opening 21 formed therein.

When an adhesive is formed by screen printing on a main surface of a printed circuit board with irregularities caused by the formation of conductor lands or the like, the mask screen and the printed circuit board cannot be closely bonded together without any gap. An increased pressure in supply of an adhesive may cause the adhesive to seep out from this gap, and thus, this pressure is generally controlled to be relatively low. However, it is more difficult to control variations in the amount of the adhesive applied as the pressure of the adhesive is decreased.

In contrast, the method of manufacturing electronic device 100 can control the shape of adhesive 3 in accordance with the shapes of projections 6a and 6b even when the pressure in supply of an adhesive is controlled to be relatively low. The method of manufacturing electronic device 100 is preferably used as the method of manufacturing an electronic device in which adhesive 3 is formed by screen printing.

The method of manufacturing electronic device 100 is also preferably used as the method of manufacturing an electronic device in which adhesive 3 is formed by any approach other than screen printing. For example, also in the method of supplying an adhesive by any approach other than screen printing, for example, by applying an adhesive with a dispenser, variations in amount applied can be prevented or reduced and the shape of adhesive 3 can be controlled in accordance with the shapes of projections 6a and 6b, as in the method using screen printing.

In the method of manufacturing electronic device 100, in the step (S10) of forming a printed circuit board, printed circuit board 1 is formed that includes conductor lands 5a and 5b (wiring pattern) formed on first main surface 1A and includes projections 6a and 6b formed in the region of first main surface 1A in which conductor lands 5a and 5b are not formed. In the step (S20) of forming adhesive 3, adhesive 3 is formed on the region of first main surface 1A in which conductor lands 5a and 5b are not formed. In the disposing step (S30), the region of first main surface 1A in which conductor lands 5a and 5b are not formed and chip capacitor 2 are mechanically connected to each other with adhesive 3. The method of manufacturing electronic device 100 further includes a step (S40) of forming solder 4 mechanically connecting conductor lands 5a and 5b and chip capacitor 2 after the disposing step (S30).

As a result, the bonding strength between printed circuit board 1 and chip capacitor 2 provided by adhesive 3 is improved more than in the case of a conventional electronic device, thus preventing the separation of printed circuit board 1 and chip capacitor 2 from each other before the step (S40). That is to say, the method of manufacturing electronic device 100 is preferably used as the method of manufacturing an electronic device in which printed circuit board 1 and chip capacitor 2 are temporarily fixed to each other with adhesive 3 before being bonded together with solder 4.

Since conductor lands 5a and 5b and projections 6a and 6b are formed simultaneously in the method of manufacturing electronic device 100, variations in the relative positional relationship between conductor lands 5a and 5b and projections 6a and 6b can be reduced more than in the case where these conductor lands and protrusions are formed in separate steps. The method of manufacturing electronic device 100 is also preferably used as the method of manufacturing an electronic device which includes the step of reheating a printed circuit board to the melting point of a solder material or a higher temperature, where the printed circuit board includes an electronic part fixed by simultaneous use of an adhesive and a solder material such as solder paste.

Embodiment 2

Figure 8:
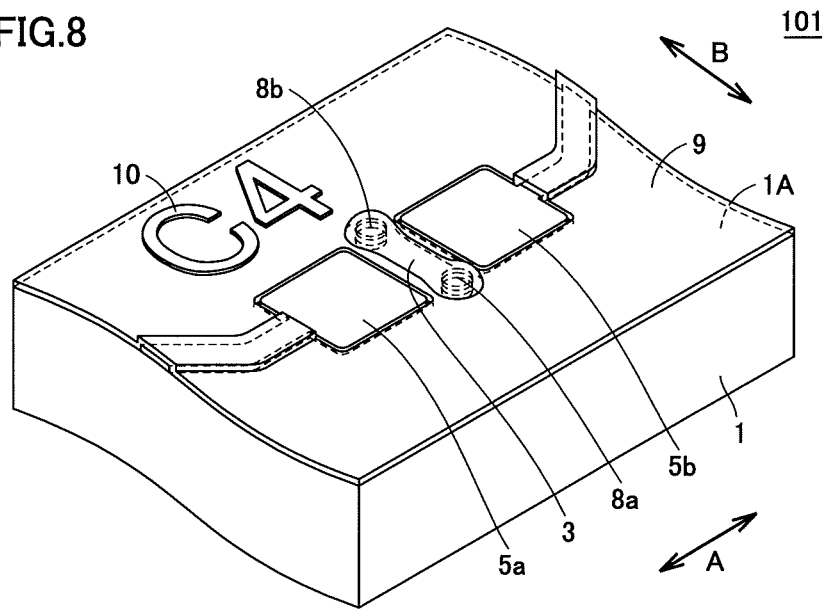
FIG. 8 is a perspective view of an electronic device according to Embodiment 2.
Figure 9:
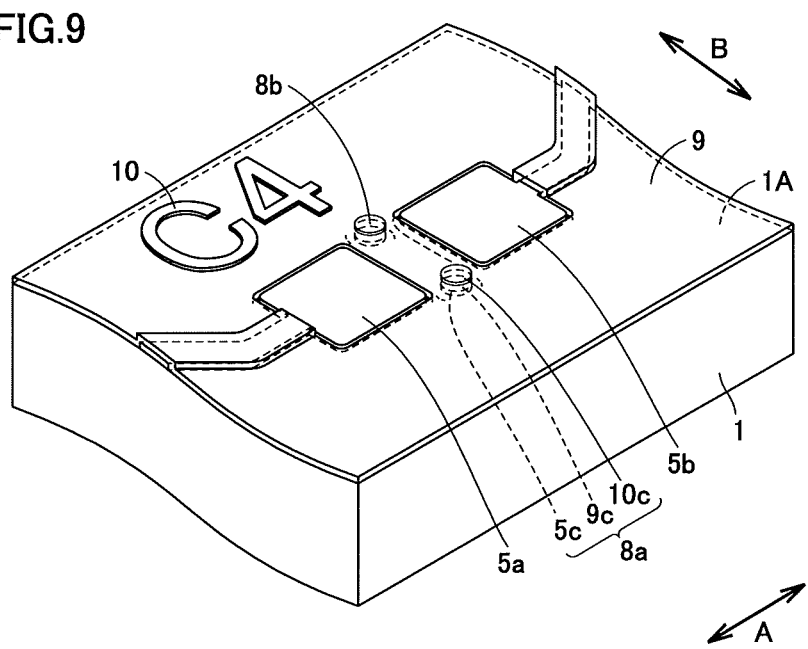
FIG. 9 is a perspective view of the electronic device shown in FIG. 8 for illustrating a projection.

An electronic device 101 according to Embodiment 2 will now be described with reference to FIGS. 8 and 9. Electronic device 101 according to Embodiment 2 basically has a configuration similar to that of electronic device 100 according to Embodiment 1 but differs from electronic device 100 in that projections 8 are formed as a laminated body of components of printed circuit board 1.

Electronic device 101 further includes a character-printed portion 10 and a protective film 9, in addition to conductor lands 5a and 5b. Character-printed portion 10 is formed in the region of first main surface 1A of printed circuit board 1 in which conductor lands 5a and 5b are not formed. Protective film 9 is formed so as to cover the components except for conductor lands 5a and 5b.

The material for protective film 9 can be any material having electrical insulation properties and is for example, a solder resist. The material for character-printed portion 10 can be any material and is, for example, a marking ink for a printed circuit board.

Projections 8a and 8b are formed as a laminated body of, for example, a first layer 5c formed simultaneously with conductor lands 5a and 5b, a second layer 9c formed simultaneously with protective film 9, and a third layer 10c formed simultaneously with character-printed portion 10.

Although the method of manufacturing electronic device 101 basically has steps similar to those of the method of manufacturing electronic device 100 according to Embodiment 1 but differs from the method according to Embodiment 1 in that character-printed portion 10 and protective film 9 are further formed in the step (S10) of forming printed circuit board 1. In the step (S10), for example, conductor lands 5a and 5b are first formed on first main surface 1A, protective film 9 is subsequently formed, and thereafter, character-printed portion 10 is formed. Consequently, printed circuit board 1 in Embodiment 2 in which projections 8 are formed is formed.

Also in this manner, projections 8a and 8b projecting in the direction perpendicular to first main surface 1A from the frontmost surface formed of protective film 9 are formed on the frontmost surface in printed circuit board 1. Electronic device 101 can thus achieve the effects similar to those of electronic device 100 according to Embodiment 1.

In electronic device 101, since projections 8a and 8b are formed as a laminated body of a plurality of components of printed circuit board 1, the heights of projections 8a and 8b from first main surface 1A can be made greater than in electronic device 100 including projections 6a and 6b formed only of a conductor layer formed simultaneously with conductor lands 5a and 5b. Electronic device 101 can thus have a connection area between chip capacitor 2 and adhesive 3 which is larger than that of electronic device 100.

Electronic device 101 can have any dimensions. In one example, the height in the direction perpendicular to first main surface 1A is 0.08 mm for conductor lands 5a and 5b, 0.04 mm for protective film 9, and 0.02 mm for character-printed portion 10. In this case, the heights of projections 8a and 8b from the frontmost surface of printed circuit board 1 are 0.10 mm when protective film 9 is formed between projections 8a and 8b. The heights of projections 8a and 8b from the frontmost surface of printed circuit board 1 are 0.14 mm when protective film 9 is not formed between projections 8a and 8b.

It suffices that projections 8a and 8b are formed as a laminated body of any components of printed circuit board 1.

Although first layer 5c, second layer 9c, and third layer 10c of projections 8a and 8b are formed so as to have the same planar dimensions on first main surface 1A, they may have other planar dimensions. Although the centers of first layer 5c, second layer 9c, and third layer 10c of projections 8a and 8b in first direction A and second direction B are formed so as to overlap with one another in the direction perpendicular to first main surface 1A, they may be formed in any other manner. From a different perspective, a relative positional shift among first layer 5c, second layer 9c, and third layer 10c of projections 8a and 8b may be caused by, for example, photolithography, which can be tolerated in electronic device 101. For example, projections 8a and 8b may be formed stepwise. For adhesive 3 formed by screen printing, all of the components of projections 8a and 8b are preferably disposed inside opening 21 of mask screen 20. However, the present invention is not limited to this configuration, and adhesive 3 may be formed with only the uppermost component (e.g., third layer 10c) disposed inside opening 21.

Figure 10:
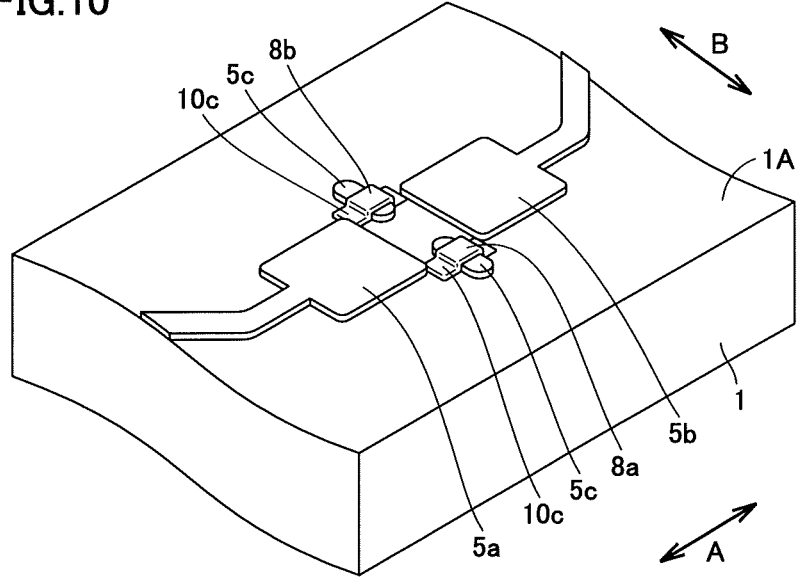
FIG. 10 is a perspective view of a modification of the electronic device according to Embodiment 2 for illustrating a projection.
Figure 11:
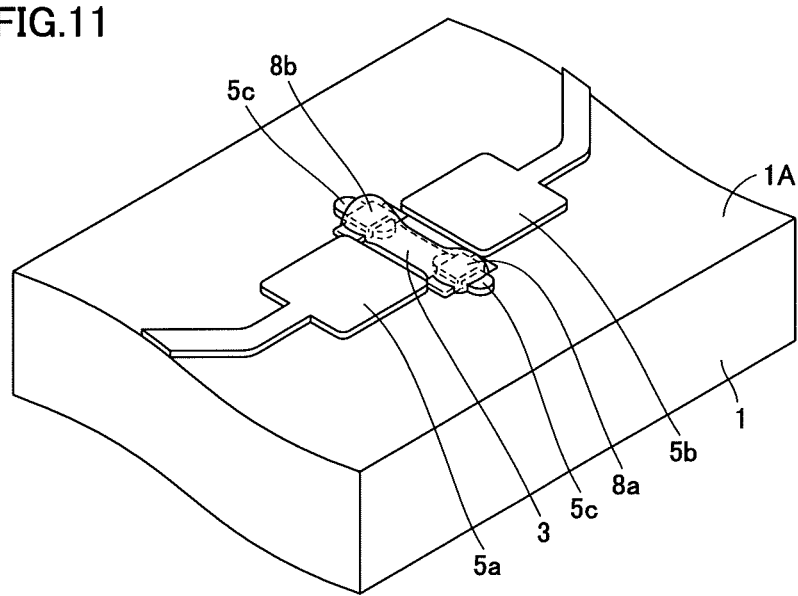
FIG. 11 is a perspective view of a modification of the electronic device of Embodiment 2 for illustrating a state in which an adhesive is applied.

FIGS. 10 and 11 are views for illustrating a modification of electronic device 101 according to Embodiment 2. With reference to FIGS. 10 and 11, a plurality of components of printed circuit board 1 are formed on first main surface 1A so as to intersect with each other, and projections 8a and 8b may be formed as intersections (laminated portions) thereof. It suffices that projections 8a and 8b are formed as a laminated portion of any components. Projections 8a and 8b are formed as, for example, a laminated portion of first layer 5c formed simultaneously with conductor lands 5a and 5b and second layer 10c formed simultaneously with character-printed portion 10. First layer 5c and second layer 10c are formed at, for example, two locations separated from each other in second direction B. For example, first layer 5c has a width in first direction A which is smaller than its width in second direction B. For example, second layer 10c has a width in first direction A which is greater than the width in second direction B and is greater than the width of first layer 5c in first direction A.

Adhesive 3 is formed in the resultant projections 8a and 8b by the method similar to the method of manufacturing electronic device 100 according to Embodiment 1, thus forming adhesive 3 so as to cover projections 8a and 8b as shown in FIG. 11. Part of each of first layer 5c and second layer 9c is, for example, exposed from adhesive 3. Also with such a configuration, an electronic device that achieves effects similar to those of electronic device 100 can be obtained by disposing an electronic part on printed circuit board 1 shown in FIG. 11 by a method similar to the method of manufacturing electronic device 100 according to Embodiment 1.

Since conductor lands 5a and 5b and first layer 5c are formed simultaneously in the electronic devices shown in FIGS. 8 to 11, a relative positional shift can be prevented or reduced. In contrast, third layer 10c or second layer 10c formed simultaneously with character-printed portion 10 may vary in the position relative to conductor lands 5a and 5b. Contrastingly, in printed circuit board 1 shown in FIGS. 10 and 11, projections 8a and 8b are formed of the intersections between first layer 5c and second layer 10c, thus preventing or reducing variations in the relative position between projections 8a and 8b and conductor lands 5a and 5b. The electronic device including printed circuit board 1 shown in FIGS. 10 and 11 can thus be manufactured stably.

Embodiment 3

Figure 12:
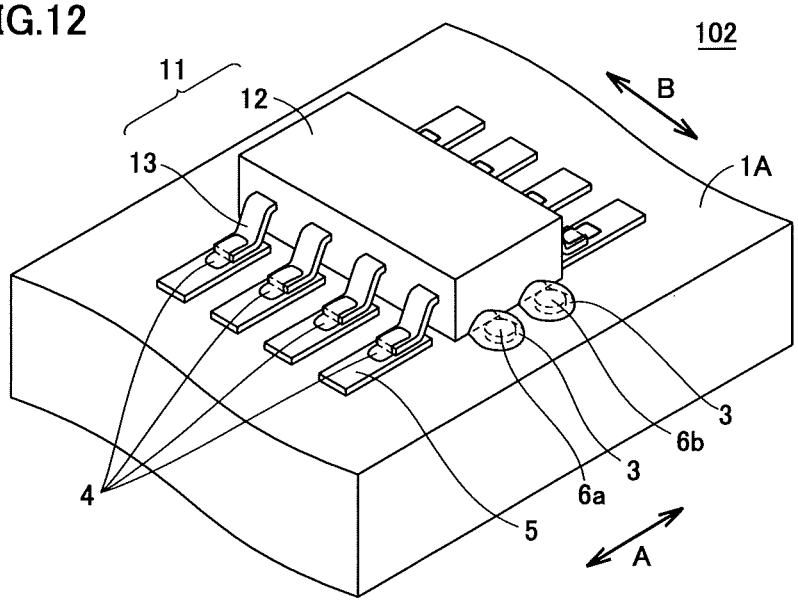
FIG. 12 is a perspective view of an electronic device according to Embodiment 3.

An electronic device 102 according to Embodiment 3 will now be described with reference to FIG. 12. Electronic device 102 basically has a configuration similar to that of electronic device 100 according to Embodiment 1 but differs from electronic device 100 in that it includes a package integrated circuit (IC) 11 as an electronic part in place of a chip capacitor.

Package IC 11 has a body 12 and a plurality of terminals 13 running outwardly from body 12. Printed circuit board 1 includes a plurality of conductor lands 5 formed on first main surface 1A, each of which is bonded to a corresponding one of the plurality of terminals 13 with solder 4.

Projections 6a and 6b are formed, for example, at a spacing therebetween in first direction A. In this case, adhesive 3 is formed at two locations spaced from each other on first main surface 1A. Adhesive 3 is formed on first main surface 1A so as to cover from part of the region of first main surface 1A which overlaps the bottom of body 12 of package IC 11 located at the side of first main surface 1A to projections 6a and 6b.

Electronic device 102 basically has a configuration similar to that of electronic device 100 according to Embodiment 1, and accordingly achieves effects similar to those of electronic device 100.

Embodiment 4

Figure 13:
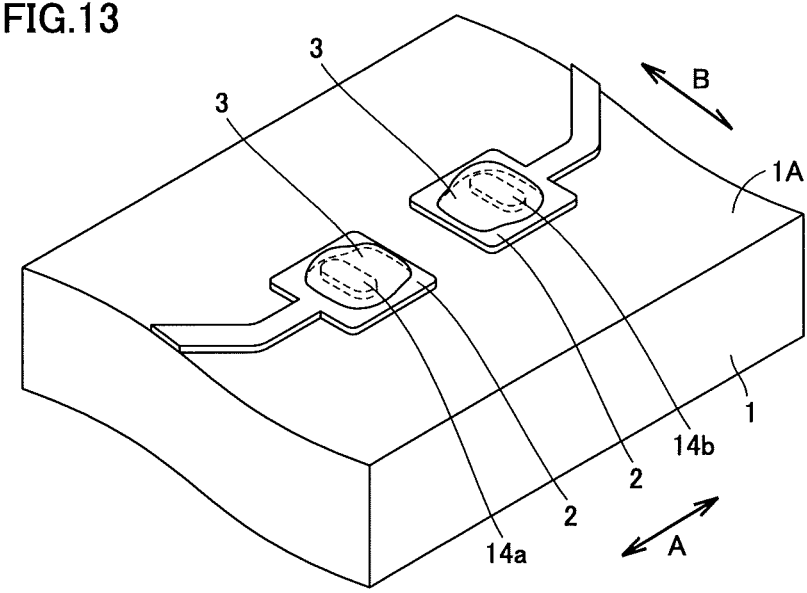
FIG. 13 is a perspective view of an electronic device according to Embodiment 4 for illustrating a state in which an adhesive is applied.
Figure 14:
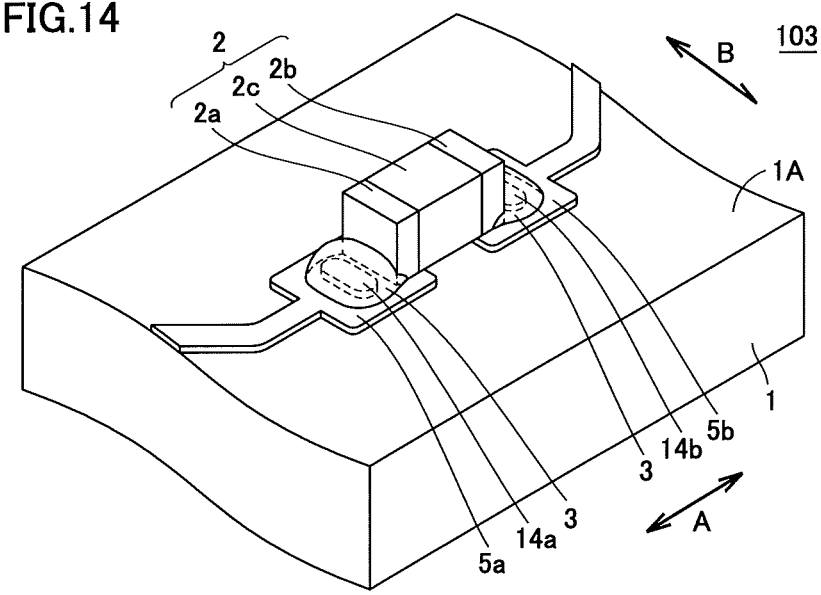
FIG. 14 is a perspective view of the electronic device according to Embodiment 4 for illustrating a state in which an electronic part is disposed on an adhesive.

An electronic device 103 according to Embodiment 4 will now be described with reference to FIGS. 13 and 14. Electronic device 103 basically has a configuration similar to that of electronic device 100 according to Embodiment 1 but differs from electronic device 100 in that adhesive 3 is formed as a conductive adhesive and that projections 14a and 14b are formed on conductor lands 5a and 5b. From a different perspective, electronic device 103 differs from electronic device 100 in that it includes no second connection member.

Projections 14a and 14b are formed so as to project in the direction perpendicular to first main surface 1A from the surfaces of conductor lands 5a and 5b. Projections 14a and 14b are formed on conductor lands 5a and 5b outside the portions thereof which are connected with electrode portions 2a and 2b of chip capacitor 2. In other words, projections 14a and 14b are formed outside the bottom surface of chip capacitor 2.

Projections 14a and 14b are formed at a spacing from electrode portions 2a and 2b of chip capacitor 2 in first direction A.

Projections 14a and 14b can have any shape and, for example, are formed such that their lateral surfaces located at the side of chip capacitor 2 in first main surface 1A extend along the outside shapes of electrode portions 2a and 2b of chip capacitor 2. Each of the opposite ends of projections 14a and 14b in second direction B is formed at a position close to a corresponding one of the opposite ends of chip capacitor 2 in second direction B. The planar shapes of projections 14a and 14b are, for example, an oval shape or elliptical shape having a major axis and a minor axis. The material for projections 14a and 14b is, for example, conductive.

Adhesive 3 is formed only on, for example, conductor lands 5a and 5b. Adhesive 3 is formed, for example, on conductor lands 5a and 5b so as to cover projections 14a and 14b. Adhesive 3 is formed on, for example, conductor land 5a to become wider at the side closer to projection 14b with respect to projection 14a. Adhesive 3 is formed on, for example, conductor land 5b to become wider at the side closer to projection 14a with respect to projection 14b.

Adhesive 3 can be any conductive adhesive and is, for example, a conductive adhesive formed of a conductive filler such as metal powder and a binder such as epoxy resin.

The method of manufacturing such an electronic device 103 basically has steps similar to those of the method of manufacturing electronic device 100 according to Embodiment 1 but differs from the method of manufacturing electronic device 100 in that printed circuit board 1 including projections 14a and 14b formed on conductor lands 5a and 5b is formed in the step (S10).

In the step (S10), projections 14a and 14b may be formed in any approach. For example, in the step (S10), a conductive pattern having a shape similar to the shapes of projections 14a and 14b is first formed on first main surface 1A. A conductive film is subsequently formed on first main surface 1A by plating. Subsequently, the conductive film is etched. In this manner, conductor lands 5a and 5b and projections 14a and 14b projecting in the direction perpendicular to first main surface 1A from the surfaces of conductor lands 5a and 5b are formed simultaneously. Projections 14a and 14b formed as described above are formed of the same material as that for conductor lands 5a and 5b.

In another example formation of projections 14a and 14b, in the step (S10), conductor lands 5a and 5b are first formed. A small amount of solder paste is subsequently applied onto conductor lands 5a and 5b, followed by heating. Consequently, projections 14a and 14b formed of solder are formed on conductor lands 5a and 5b.

Projections 14a and 14b may be formed of, for example, any components of printed circuit board 1. For example, projections 14a and 14b may be formed of components such as a solder resist and a character-printed portion or may be formed of any non-conductive material.

Although the electronic part is formed as chip capacitor 2 or package IC 11 in electronic devices 100 to 103 according to Embodiments 1 to 4, the present invention is not limited thereto. The electronic part can be any electronic part that can be mounted on printed circuit board 1.

It suffices that in electronic devices 100 to 103 according to Embodiments 1 to 4, at least the top portions of projections 6a, 6b, 8a, 8b, 14a, and 14b are formed outside the bottom surface of chip capacitor 2. The portions of projections 6a, 6b, 8a, 8b, 14a, and 14b having a height which is smaller in the direction perpendicular to first main surface 1A than the top portions of these projections may be formed so as to overlap the bottom surface of chip capacitor 2. Projections 6a, 6b, 8a, 8b, 14a, and 14b may be formed so as to circumscribe the bottom surface of chip capacitor 2. That is to say, distance W1 (see FIG. 2) between projections 6a and 6b, 8a and 8b, 14a and 14b in second direction B may be equal to width W2 in the direction perpendicular to the portion between electrode portions in the bottom surface.

Although chip capacitor 2, 11 and conductor lands 5a and 5b are electrically and mechanically connected to each other with solder 4 serving as a second connection member in electronic devices 100 to 102 according to Embodiments 1 to 3, the present invention is not limited thereto. The second connection member can be formed of any material as long as it can electrically connect printed circuit board 1 and an electronic part. For example, the electronic part may be electrically connected to a wiring pattern by a bonding wire or the like serving as a second connection member. Also with this configuration, in electronic devices 100 to 102, a connection area between a lateral surface of the electronic part and adhesive 3 serving as a first connection member is sufficiently large, and the electronic part is firmly bonded to printed circuit board 1 with adhesive 3. This prevents the electronic part from being detached from printed circuit board 1.

Although the embodiments of the present invention have been described above, the embodiments above can be modified in various manners. Moreover, the scope of the present invention is not limited to the embodiments above. The scope of the present invention is defined by the terms of the claims, and is intended to include any modifications within the scope and meaning equivalent to the terms of the claims.

REFERENCE SIGNS LIST 1 printed circuit board, 1A first main surface, 2 ceramic chip capacitor, 3 adhesive, 4 solder, 5, 5a, 5b conductor land, 6, 6a, 6b, 8, 8a, 8b, 14a, 14b, projection, 9 protective film, 10 character-printed portion, 13 terminal, 20 mask screen, 21 opening, 100, 101, 102, 103 electronic device. surface.

The invention claimed is:

1. An electronic device comprising:
a printed circuit board having a first main surface;
an electronic part mounted on the first main surface; and
a first connection member connecting the printed circuit board and the electronic part,
the printed circuit board including at least one projection formed on the first main surface so as to project in a direction crossing the first main surface,
the at least one projection being formed outside a bottom surface of the electronic part located at a side of the first main surface,
the first connection member being in contact with at least part of the at least one projection, at least part of the bottom surface of the electronic part, and at least part of a lateral surface of the electronic part intersecting the bottom surface,
the first connection member is formed so as to entirely cover at least a top surface of the at least one projection,
the printed circuit board includes a wiring pattern formed on the first main surface,
the at least one projection is formed on a region of the first main surface in which the wiring pattern is not formed,
the at least one projection is formed at a spacing from a perimeter of the bottom surface, and
the spacing is greater than or equal to a height of the at least one projection in a direction perpendicular to the first main surface and is smaller than or equal to a width of the at least one projection in a direction extending along the first main surface and extending from the electronic part toward the at least one projection.

2. The electronic device according to claim 1, wherein
the printed circuit board includes a plurality of projections,
a distance between the plurality of projections is greater than a width of the bottom surface of the electronic part in a direction extending along the first main surface and extending from the electronic part toward one of the plurality of projections.

3. The electronic device according to claim 1, wherein
the first connection member mechanically connects the electronic part and the region of the first main surface in which the wiring pattern is not formed, and
the electronic device further comprises a second connection member electrically connecting the wiring pattern and the electronic part.

4. The electronic device according to claim 3, wherein
part of the electronic part is disposed on the wiring pattern, and
a material for the second connection member includes a solder.

5. A method of manufacturing an electronic device including a printed circuit board and an electronic part, the method comprising:
forming the printed circuit board having a first main surface and including at least one projection formed on the first main surface so as to project in a direction crossing the first main surface;
forming on the first main surface a first connection member for connecting the printed circuit board and the electronic part; and
after forming the first connection member on the first main surface, disposing the electronic part on the first main surface,
in the forming of the printed circuit board, the at least one projection being formed on the first main surface located outside a bottom surface of the electronic part disposed at a side of the first main surface in the disposing,
in the forming of the first connection member, the first connection member being formed on the first main surface so as to cover from part of a region of the first main surface to at least part of the at least one projection located at a side of the bottom surface, the region overlapping the bottom surface of the electronic part disposed in the disposing,
in the disposing, the first connection member being formed so as to entirely cover at least a top surface of the at least one projection by disposing the electronic part on the first main surface such that the bottom surface of the electronic part disposed at the side of the first main surface overlaps the first connection member and does not overlap the at least one projection,
in the forming of the printed circuit board, the printed circuit board including a wiring pattern formed on the first main surface and including the at least one projection formed in a region of the first main surface in which the wiring pattern is not formed is formed.

6. The method according to claim 5, wherein in the forming of the first connection member, the first connection member is formed by screen printing using a mask screen having an opening formed therein.

7. The method according to claim 5, wherein
in the forming of the first connection member, the first connection member is formed in the region of the first main surface in which the wiring pattern is not formed,
in the disposing, the region of the first main surface in which the wiring pattern is not formed and the electronic part are mechanically connected by the first connection member, and
the method further comprises forming a second connection member electrically connecting the wiring pattern and the electronic part after the disposing.

8. An electronic device comprising:
a printed circuit board having a first main surface;
an electronic part mounted on the first main surface; and
a first connection member connecting the printed circuit board and the electronic part,
the printed circuit board including at least one projection formed on the first main surface so as to project in a direction crossing the first main surface,
the at least one projection being formed outside a bottom surface of the electronic part located at a side of the first main surface,
the first connection member being in contact with at least part of the at least one projection, at least part of the bottom surface of the electronic part, and at least part of a lateral surface of the electronic part intersecting the bottom surface,
the first connection member is formed so as to cover the at least one projection, the printed circuit board includes a wiring pattern formed on the first main surface, the at least one projection is formed on the wiring pattern and projects from the wiring pattern in a direction away from the first main surface, a material for the first connection member is conductive, and the first connection member electrically and mechanically connects the wiring pattern and the electronic part.

9. A method of manufacturing an electronic device including a printed circuit board and an electronic part, the method comprising:

- forming the printed circuit board having a first main surface and including at least one projection formed on the first main surface so as to project in a direction crossing the first main surface;
- forming on the first main surface a first connection member for connecting the printed circuit board and the electronic part; and
- after forming the first connection member on the first main surface, disposing the electronic part on the first main surface,
- in the forming of the printed circuit board, the at least one projection being formed on the first main surface located outside a bottom surface of the electronic part disposed at a side of the first main surface in the disposing,
- in the forming of the first connection member, the first connection member being formed on the first main surface so as to cover from part of a region of the first main surface to at least part of the at least one projection located at a side of the bottom surface, the region overlapping the bottom surface of the electronic part disposed in the disposing,
- in the disposing, the first connection member being formed so as to cover the at least one projection by disposing the electronic part on the first main surface such that the bottom surface of the electronic part disposed at the side of the first main surface overlaps the first connection member and does not overlap the at least one projection,
- in the forming of the printed circuit board, the printed circuit board including a wiring pattern formed on the first main surface and including the at least one projection formed on the wiring pattern and projecting from the wiring pattern in a direction away from the first main surface is formed.

10. The method according to claim 9, wherein a material for the first connection member is conductive, and in the disposing, the wiring pattern and the electronic part are electrically connected on the first main surface by the first connection member.

* * * * *